United States Patent
Radley

(10) Patent No.: US 9,202,838 B2
(45) Date of Patent: Dec. 1, 2015

(54) SEMICONDUCTOR DEVICE CONNECTION

(76) Inventor: Ian Radley, Bishop Auckland Durham (GB)

( * ) Notice: Subject to any disclaimer, the term of this patent is extended or adjusted under 35 U.S.C. 154(b) by 1020 days.

(21) Appl. No.: 13/127,893

(22) PCT Filed: Nov. 19, 2009

(86) PCT No.: PCT/GB2009/051570
§ 371 (c)(1),
(2), (4) Date: Jun. 14, 2011

(87) PCT Pub. No.: WO2010/058217
PCT Pub. Date: May 27, 2010

(65) Prior Publication Data
US 2011/0260279 A1    Oct. 27, 2011

(30) Foreign Application Priority Data
Nov. 20, 2008 (GB) ................. 0821158.3

(51) Int. Cl.
*H01L 21/50* (2006.01)
*H01L 27/146* (2006.01)
*H01L 23/00* (2006.01)

(52) U.S. Cl.
CPC .......... *H01L 27/14634* (2013.01); *H01L 24/32* (2013.01); *H01L 24/63* (2013.01); *H01L 24/64* (2013.01); *H01L 27/1469* (2013.01); *H01L 27/14636* (2013.01); *H01L 2924/0103* (2013.01); *H01L 2924/014* (2013.01); *H01L 2924/01005* (2013.01); *H01L 2924/01006* (2013.01); *H01L 2924/01025* (2013.01); *H01L 2924/01032* (2013.01); *H01L 2924/01033* (2013.01);

(Continued)

(58) Field of Classification Search
CPC .............................. H01L 27/146; H01L 21/50
USPC .......................................................... 438/119
See application file for complete search history.

(56) References Cited

U.S. PATENT DOCUMENTS 6,242,746 B1    6/2001 Teranuma et al.
7,338,896 B2 *  3/2008 Vanhaelemeersch et al. 438/638

(Continued)

FOREIGN PATENT DOCUMENTS

EP    1387397 A2    4/2004
EP    1 598 863      11/2005

(Continued)

OTHER PUBLICATIONS

International Preliminary Report on Patentability and Written Opinion, dated May 24, 2011, 6 pages.

(Continued)

*Primary Examiner* — Tran Tran
(74) *Attorney, Agent, or Firm* — Drinker Biddle & Reath LLP

(57) ABSTRACT

A method of bonding a semiconductor structure to a substrate to effect both a mechanical bond and a selectively patterned conductive bond, comprising the steps of mechanically bonding a semiconductor structure to a substrate by means of a bonding layer; providing gaps in the bonding layer generally corresponding to a desired conductive bond pattern; providing vias though the substrate generally positioned at the gaps in the bonding layer; causing electrically conductive material to contact the semiconductor structure exposed through the vias. A device made in accordance with the method is also described.

9 Claims, 2 Drawing Sheets

(52) U.S. Cl.
CPC ............... *H01L2924/01057* (2013.01); *H01L 2924/01077* (2013.01); *H01L 2924/01078* (2013.01); *H01L 2924/14* (2013.01)

(56) References Cited

U.S. PATENT DOCUMENTS

| | | | |
|---|---|---|---|
| 2006/0197007 A1 | 9/2006 | Iwabuchi et al. | |
| 2007/0018263 A1 | 1/2007 | Noma | |
| 2009/0017248 A1* | 1/2009 | Larson et al. | 428/41.5 |

FOREIGN PATENT DOCUMENTS

| | | |
|---|---|---|
| EP | 1 686 617 | 8/2006 |
| JP | 200463751 A | 2/2004 |
| JP | 2006184010 A | 7/2006 |
| JP | 2006228913 A | 8/2006 |
| JP | 2007-173861 A | 7/2007 |

OTHER PUBLICATIONS

International Search Report, dated Feb. 22, 2010, 3 pages.
JP Examination Report for JP Application No. 2011-536950, pp. 4, (includes English Translation), Dec. 3, 2013.
Japanese Office Action, from Japanese Application 2011-536950, dated Nov. 4, 2014, 9 pgs (including English Translation).

* cited by examiner

SEMICONDUCTOR DEVICE CONNECTION

FIELD OF THE INVENTION

The invention relates to a method of connection of a semiconductor device structure such as a pixel detector structure to a substrate such as an electronics chip or circuit substrate in such manner as to effect both a mechanical bond and an electrical connection therebetween. The invention also relates to an assembly so connected.

The invention in particular relates to a pixel device structure, and in particular a pixel detector chip, for high energy physics applications, such as a detector for high energy radiation, and especially to a detector comprising a large direct band gap semiconductor material such as cadmium telluride, cadmium zinc telluride, cadmium manganese telluride or the like.

BACKGROUND

Pixellated radiation detector structures comprising a detector material having a pixellated structure to define a plurality of individual elements across an area of detector material, typically to convert an area modulated incident radiation into an area modulated photoelectric response, have found increasing application in recent years. The principle is used for instance in silicon or other semiconductor based charge coupled devices (CCDs) for use in digital photography, optical and IR spectroscopy and the like.

For such applications it is typically necessary to bond a detector comprising suitably pixellated semiconductor material both conductively and mechanically to a substrate carrying or connecting with control electronics. In particular, a substrate is an electronic substrate, such as a printed circuit board, or a semiconductor chip such as an integrated circuit etc.

A common technique is referred to as bump bonding or flipchip bonding. In accordance with this technique, an appropriate pattern of bumps of conductive material is first laid down either on the detector structure or on a substrate circuit by any suitable technique, the bump pattern corresponding to the desired conductor connection pattern. A bump may be laid down for example by an evaporation, sputtering or plating technology. Suitable techniques include evaporation through a mask, evaporation with a thick photoresist, screen printing, stud bumping, electroplating and vias, and the provision of conductive polymer bumps.

The material of the bump bond is a material which is such as to establish a conducting connection between the two components when brought together when subject to a secondary treatment. For example it is a reflowable or annealable conductor such as a solder or the like, a curable conductive adhesive etc. To effect this conductive connection with the second element, the first element, onto which the bump has been placed, is flipped and placed into correctly positioned contact with the second element, and the bump bond material is reflowed, cured or otherwise treated to effect a selectively patterned conductive connection between the detector and the substrate. This necessarily leaves gaps in the unconnected regions between the conductive connection pattern. These gaps are underlined with a suitable dielectric material to secure an improved mechanical bond.

It is a characteristic of the flipchip bonding process that the conductive bond is created first, and the mechanical bond conferred by the underfill is created secondarily. Practical considerations often mean that the material forming the conductive bond is a low temperature bonded material, and that the electrical bonds are small. These and other factors can leave them mechanically weak and fragile. Over time, as the bonded structures are subject to mechanical stresses and strains, the conductive bonds can break resulting in a loss of conduction path. The underfill process is intended to give some additional mechanical strength, but is difficult to achieve consistently, especially with complex pixel structures.

Typical pixel detectors based on silicon and like semiconductor materials, for example for use in CCDs, tend to be provided for optical or near-optical range applications with pixel sizes typically less than 200 μm and often less than 100 μm.

Newer materials such as large direct band gap semiconductor materials that are designed to operate with much higher energy radiation, and for example to operate as direct band gap X-ray or gamma-ray pixel detectors, may be less susceptible to such a technique. Both mechanical and dielectric considerations are different. A larger pixel size is typical, for example up to 2 mm. Much higher radiation densities can be expected in use. The material of the device structure has to be relatively thicker. Mechanical considerations can be very difficult when compared with optical or infrared silicon devices. Inconsistent underfill flow can be more of an issue. Silicon technology does not necessarily transfer readily to such materials and pixellated structures.

SUMMARY OF THE INVENTION

In accordance with the invention there is provided a method of bonding a semiconductor structure, for example being a pixellated device structure such as a pixel detector structure, to a substrate to effect both a mechanical bond and a selectively patterned conductive bond, comprising the steps of:

mechanically bonding a semiconductor structure to a substrate by means of an intermediate bonding layer;
providing gaps in the bonding layer generally corresponding to a desired conductive bond pattern;
providing vias though the substrate generally positioned at the gaps in the bonding layer;
causing electrically conductive material to contact the semiconductor structure exposed through the vias;
optionally and to the extent necessitated by the nature of the conductive material, further treating the conductive material to complete a conductive connection between the semiconductor structure and the substrate.

The method of the invention presents one fundamental difference with a bump bonding method. The intermediate mechanical bonding/dielectric layer is created first, rather than being added subsequent to the provision of conductors by a backfill process. This offers a potential for significant improvement in mechanical strength and mechanical and dielectric consistency.

The bonding layer is for example a curable material, for example a curable flowable polymer, such as a curable adhesive. It may for example be curable by a thermal cure, a chemical cure, a light cure such as a UV cure, or combinations thereof. The bonding layer is caused to flow between and effect, for example when cured in situ, a mechanical connection between the device structure and the substrate.

As used herein "substrate" is to be taken generally to refer to a second layer or layers to which a semiconductor device structure is bonded by the method of the invention by means of an intermediate bonding layer, and to such a second layer in a device assembly so fabricated. Such a second layer or layers may comprise for example an electrically functional layer such as a printed circuit board or a semi-conductor chip, a mechanically functional layer, a dielectric layer, combinations thereof etc. It is to be understood that use of the term "substrate" for this layer is intended to imply no further limitation of geometry, either as regards the method or the device assembly.

Two example methods are advanced by means of which a bonding layer, for example of a curable material such as a curable flowable polymer, can be laid down in such manner as to allow for the subsequent provision of conductors a desired conductive bond pattern by providing gaps in the bonding layer generally corresponding to a desired conductive bond pattern and generally corresponding to the vias.

In a first example method, the step of providing gaps in the bonding layer generally corresponding to a desired conductive bond pattern comprises the steps of:

providing a complete bonding layer substantially free of through gaps to extend across the surface of a semiconductor structure to mechanically bond the semiconductor structure to a substrate;

providing vias though the substrate;

removing material from the bonding layer at the location of the vias to expose areas on the surface of the semiconductor structure.

The intermediate bonding layer is thus laid down initially complete and material selectively removed in a selective pattern as appropriate to the required electrical connection between the substrate and the semiconductor structure to expose conducting areas of the surface of the underlying semiconductor structure in an appropriate pattern. The removal is effected through the vias provided in the substrate.

This example method has the virtue of inherently aligning the selectively patterned areas with the vias, as the latter are used to create the former.

In a second example method, the step of providing gaps in the bonding layer generally corresponding to a desired conductive bond pattern comprises the steps of:

providing a bonding layer by depositing a bonding layer material including gaps generally in a desired conductive bond pattern;

mechanically bonding the semiconductor structure to the substrate by means of the bonding layer, for example by curing the same.

Conductive material is then added by any suitable process through the vias so as to be applied to the exposed surface of the semiconductor structure in an appropriate pattern to effect electrical connection between the semiconductor structure and the substrate. Any suitable conductive material may be used to form such conductors. If, by analogy with prior art techniques, a conductive material is used which requires additional treatment, for example by reflow, annealing, curing or the like, to effect this secondary electrical connection, then optionally a further secondary treatment step is applied.

The provision of vias in the substrate is thus advantageous in that it provides a means by which conductors can be applied to the selectively patterned surface of the semiconductor structure. Substrate vias may be created in the substrate before or after creating the bonding layer.

In a preferred embodiment of the method, comprising the first example method above described, the vias additionally enable removal of the bonding layer at the via locations, corresponding to intended electrical bond locations and thus inherently align vias and electrical bond locations for this subsequent step.

More completely, in the preferred embodiment the method comprises the steps of:

mechanically bonding a semiconductor structure to a substrate by means of an intermediate bonding layer;

providing vias though the substrate;

removing material from the bonding layer at the location of the vias to expose a surface of the semiconductor structure;

depositing electrically conductive material on the semiconductor structure;

to the extent necessitated by the nature of the conductive material, further treating the conductive material to complete a conductive connection between the semiconductor structure and the substrate.

In one possible embodiment of the first example method, the step of removing material through the vias comprises selectively chemically etching material from the bonding layer through the vias. Optionally, this selective etching is via a two stage process where material is first selectively developed, for example chemically or by exposure to light, through the vias (being unexposed to the developing agent in the regions other than those where vias have been created), so as to be more susceptible to removal then exposed material is chemically removed. For example, material making up the bonding layer is selectively removed through the vias via a photolithographic technique, In a possible embodiment, to facilitate this, the material of the bonding layer is photosensitive and photocurable e.g. to visible, UV or other suitable light, and in particular is a positive photoresist. In an alternative variation of this general principle the material of the bonding layer is not in itself a photoresist, but an additional photoresist layer is applied as part of the process of forming and on the surface of the bonding layer, which may then be exposed through the vias and developed in a manner which assists in, and for example catalyses, the selective etching by dissolution of the underlying bonding layer material.

In the preferred embodiment, the bonding material is a photosensitive material such as a photoresist, and the removal process comprises exposing the photoresist in the selectively patterned areas through the selectively patterned vias, removing exposed material by selective etching by dissolution through the vias, and filling the vias at least to the extent necessary to make a conductive connection by depositing conductive material on the surfaces of the device structure exposed thereby.

In an alternative embodiment of the method, comprising the second example method above described, the gaps in the bonding layer are provided prior to bonding, and aligned vias are created in the bonded structure either by creating vias prior to bonding in appropriate pattern and careful alignment at the bonding stage such that the vias in the substrate are generally positioned correspondingly to the gaps in the bonding layer or by creating vias in appropriate pattern after bonding.

In this case, the selectively patterned areas defining the conduction patterns are created prior to bonding. In this case, it is not necessary for the bonding material to be adapted for subsequent removal, for example being a photoresist, and a wider range of bonding materials may be considered, although the inherent alignment advantages of the first example method above described do not accrue.

However it remains the case with either alternative described in detail above, and is the particular characterising distinction of the method of the invention, that the bonding layer is created first to create a sound mechanical contact and the conductive contacts created subsequently through the vias.

The bonding layer also serves as a dielectric layer, comprising a layer of material of the correct dielectric properties to avoid interpixel leakage/signal degradation. Accordingly, the material of the bonding layer also comprises a suitably selected dielectric material. It is a further advantage of the invention that, in addition to improving the consistency of the mechanical bond by laying down the bonding layer first, the dielectric consistency of the layer is also improved since the tendency for gaps is much reduced even with complex pixel structures.

Any suitable method may be used to create selectively patterned contact areas on the surface of the semiconductor structure and to any suitable method may be used complete conductive contact with the selectively patterned contact areas through the vias.

In a possible method step, selectively patterned contact areas on the surface of the semiconductor structure may be created by deposition thereon of a layer of electrically conductive material. Advantageously, selectively patterned contact areas may be created by deposition onto the surface of the semiconductor structure of a layer of electrically conductive material through the vias after fabrication of the bonded structure. Alternatively, selectively patterned contact areas may be created by deposition onto the surface of the semiconductor structure of a layer of electrically conductive material prior to bonding. Depositing may for example be by plating or sputtering. Further alternatively, selectively patterned contact areas on the surface of the semiconductor structure may be created integrally to the semiconductor structure prior to bonding.

Conductive contact with the selectively patterned contact areas is then completed after mechanical bonding by introduction of conductive material through the vias. In one alternative this is effected by depositing electrically conductive material through the via. For example electrically conductive material is plated or sputtered into the via and onto the contact surface of exposed semiconductor to complete a conductive connection. In another alternative this is effected by passing an elongate electrical conductor through the via and causing a conductive connection to be made onto the contact surface.

In accordance with the invention in a further aspect there is provided a semiconductor device assembly fabricated in accordance with the foregoing process. Specifically there is provided a device assembly comprising a mechanically and conductively bonded combination of a semiconductor structure such as a pixel detector and a substrate such as an electronic circuit substrate, the device comprising:
a semiconductor structure;
a substrate;
an intermediate layer effecting a mechanical bond therebetween;
selectively patterned areas of the intermediate layer corresponding to selectively patterned vias in the substrate, and defining gaps in the said intermediate layer to expose a surface of the device;
conductor material in the selectively patterned areas to effect a conductive contact between the exposed surfaces of the device and the substrate.

The semiconductor device assembly is fabricated in accordance with the foregoing process. In a particular embodiment hereinbefore described the selectively patterned areas of the intermediate layer comprise selectively patterned areas removed from the intermediate layer after effecting the mechanical bond. Alternative selectively patterned areas fabricated by alternative embodiments of the method above described can also be envisaged. However, in all cases, the bonding layer is created first to create a consistent mechanical contact, and the conductive contact created subsequently through the vias.

The substrate is for example an electronic circuit, such as a semiconductor integrated circuit, a printed circuit board or the like. The substrate is for example another semiconductor structure.

The semiconductor structure is for example a pixellated device structure and for example a pixel detector structure comprising a radiation detector having a pixellated structure to define a plurality of individual pixels across an area of the detector material.

The intermediate bonding layer is formed of a suitable dielectric material capable of creating a mechanical bond between the semiconductor structure and the substrate and is for example a curable material and in particular a flowable curable material which has been cured.

Preferably the material of the intermediate bonding layer is also a photoresist. For example the material is a positive photoresist. Conveniently, the material is a photoresist developed by UV or shorter wavelength electromagnetic radiation.

The conductive material may have been subject to a treatment once in situ to create/ensure a sound conductive contact. The conductive material is for example a conductive adhesive, which has for example been cured in situ to create a conductive contact between the substrate and the structure. Alternatively the conductive material is a reflowable material such as a solder which has been reflowed in situ. Alternatively the conductive material is an annealable material which has been annealed in situ.

The semiconductor device structure preferably comprises a radiation detector.

The semiconductor device structure preferably comprises a semiconductor material for high energy application, for example to detect high energy radiation, and is conveniently for example a direct band gap semiconductor.

Conveniently the semiconductor device structure comprises a semiconductor material adapted for use with, and for example to exhibit a photoelectric response to, incident radiation, and particularly preferably high energy radiation, for example ionising radiation, for example high energy electromagnetic radiation such as x-rays and/or gamma rays, or subatomic particle radiation.

Preferably the semiconductor device structure semiconductor material is adapted to be active across a relatively broad spectrum of such radiation, for example across at least one or more parts of the range of 20 keV to 1 MeV, and more preferably across at least a part, and for example a major part, of the range of 20 keV to 160 keV. For example the device structure semiconductor material is adapted to be active across at least one bandwidth of at least 20 keV within the given range. For example the semiconductor device material is adapted to be active across a bandwidth such that at least three 10 keV bands can be resolved within that range.

Preferably the device structure and/or semiconductor material is adapted to produce spectroscopic resolution in that it exhibits a direct spectroscopic response across its active spectrum. The material is selected to exhibit inherently as a direct material property a direct variable electrical and for example photoelectric response to different parts of the spectrum. The material is thus capable of detecting and collecting spectroscopically resolvable information about incident radiation in the sense that it is adapted to differentiate incident radiation simultaneously into plural separate energy bands across the spectrum of a source.

Preferably the semiconductor material is formed as a bulk crystal, and for example as a bulk single crystal or as multiple layers of bulk single crystal elements (where bulk crystal in this context indicates a thickness of at least 500 µm, and preferably of at least 1 mm).

The materials making up the semiconductor device structure are preferably selected from cadmium telluride, cadmium zinc telluride (CZT), cadmium manganese telluride (CMT), germanium, lanthanum bromide, thorium bromide. Group II-VI semiconductors, and especially those listed, are particularly preferred in this regard. The materials are more preferably selected from cadmium telluride, cadmium zinc telluride (CZT), cadmium manganese telluride (CMT) and alloys thereof, and for example comprise crystalline $Cd_{1-(a+b)}Mn_aZn_bTe$ where a and/or b may be zero.

BRIEF DESCRIPTION OF THE DRAWINGS

The invention will now be described by way of example only with reference to FIGS. 1a, 1b and 2a, 2b, which comprise schematic cross sections through a simplified device prepared in accordance with the principles of the invention to illustrate two alternative embodiments of the method.

DESCRIPTION OF THE PREFERRED EMBODIMENTS

Figure 1A:
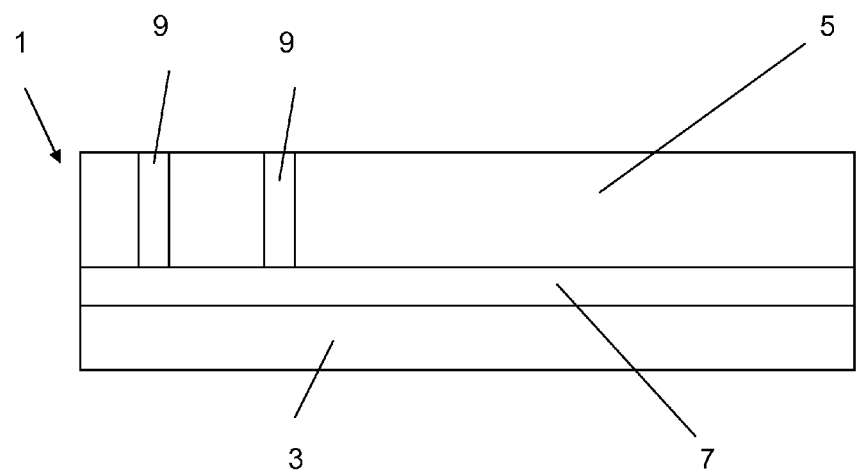
Figure 1B:
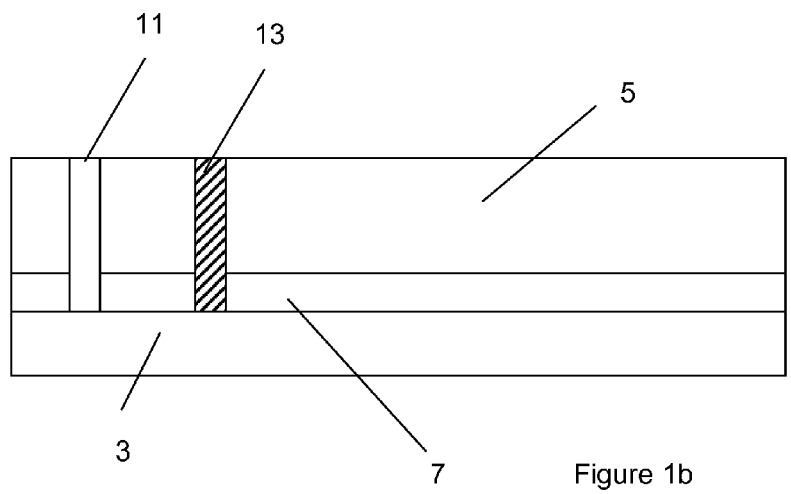

According to FIGS. 1a and 1b, a three layer structure is illustrated. This three layer structure comprises a pixellated detector 3 comprising cadmium telluhde with pixellated contacts, a printed circuit board 5 carrying device electronics, and an intermediate bonding layer 7 comprising a suitable adhesive/dielectric.

In accordance with the method of the invention, vias 9 of about 1 mm diameter are provided in the printed circuit board 5 either before or after the structure is bonded together. Thus, in the assembled structure, a bonding layer 7 effects a primary mechanical bond between the pixel detector 3 and the PCB 5, and a surface of this bonding layer is selectively exposed by the provision of vias in the PCB 5, either before or after the, in the printed circuit board in an appropriate pattern. This is shown in FIG. 1a.

In accordance with this example embodiment, the material of the bonding layer 7 is then selectively removed in the selectively patterned areas provided by the vias 9 creating vias 11 which as shown in FIG. 1b pass through the PCB 5 to the exposed contact surface of the pixellated detector 3. Conveniently, the material is removed via a selective chemical process facilitated by the presence of the vias, and is for example removed photolithigraphically. To facilitate this, in the embodiment the material of the bonding layer 7 is also a photoresist, preferably a photoresist soluble in basic developer when exposed, for example, diazonaphtoquinone based photoresist, phenolic resins or phenolic resin impregnated with diazonaphtoquinone. This is exposed and developed through the via to expose the underlying surface of the pixel device structure.

The exposed surface of the cadmium telluride pixellated detector device structure layer is then provided with a suitable conductive material, which is deposited and for example plated or sputtered into the via and onto the pixellated contact surface of the cadmium telluride layer thereby exposed in such manner and to the extent necessary to complete a conductive connection between the cadmium telluride pixellated detector layer 3 and the PCB 5. One of the vias 11 in FIG. 1b is shown with such a contact 13.

Figure 2A:
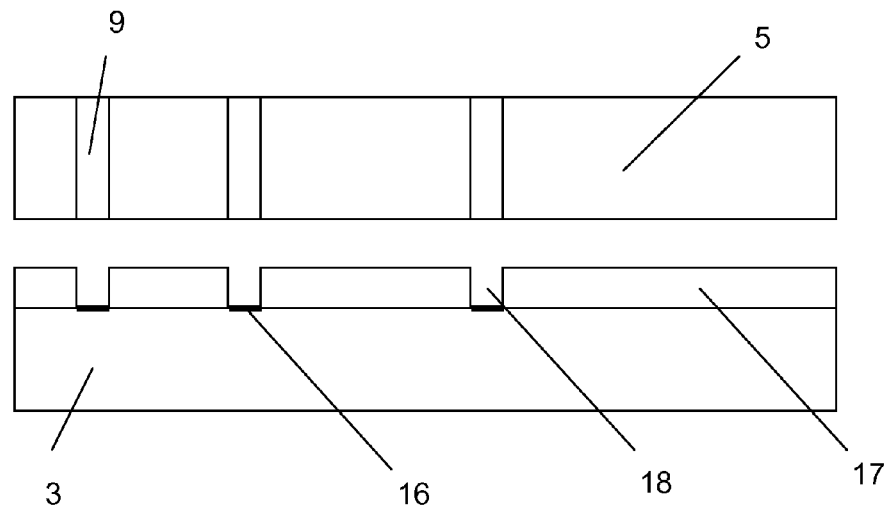
Figure 2B:
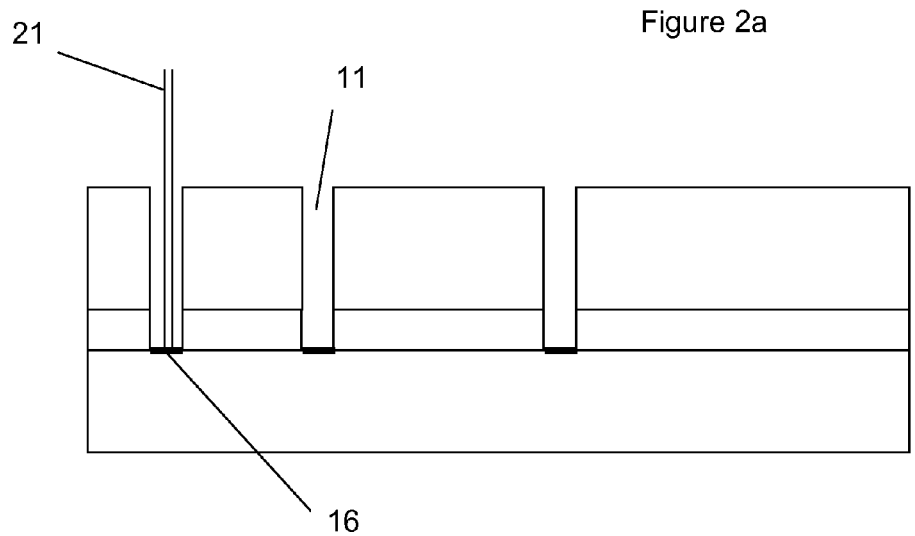

According to FIGS. 2a and 2b, a similar three layer structure is illustrated and like numerals are used where appropriate. This three layer structure again comprises a pixellated detector 3 comprising cadmium telluride with pixellated contacts, a printed circuit board 5 carrying device electronics and with vias 11. However, the configuration of contact and bonding layer differs, as can be seen in the unbounded state in FIG. 2a.

An intermediate bonding layer 17 is again provided comprising a suitable adhesive/dielectric but in this case the adhesive is laid down patterned with gaps 18 prior to curing. The gaps 18 correspond to pre-deposited areas of conductive layers 16 on the detector 3 which define the patterned contact structures.

The PCB 5 and detector 3 are then brought together in such manner that the gaps 18 and the vias 9 are aligned and the adhesive is cured. The result, shown in FIG. 2b, is that the gaps 18 and the vias 9 create complete through vias 11 through which the conductive areas 16 are exposed. In this case a contact is completed by passing a conductive wire 21 through the via 11.

It will be appreciated that the alternative methods of creating contact areas on the semiconductor structure, creating a mechanically bonded assembly in which vias align with the contact areas, and completing electrical contact through the vias subsequently, are process steps which are sufficiently independent that examples of each step from the foregoing embodiments can equally be presented in alternative combinations.

It can be noted that it is characteristic of the present invention that the mechanical bonding layer (which also serves as a dielectric layer between the selectively patterned contact structures) is laid down first. This is then removed only in the selectively patterned areas and conducting contacts laid down in those areas.

There is consequently the potential for significantly improved mechanical strength and conductive consistency when compared with prior art bump bonding methods where the conducting contacts are laid down first, and the structural bonding/dielectric layer is provided via a secondary infill process. The resultant structure is characteristically distinct from a bump bonded structure, both because of the presence of vias and because of differences in the intermediate layer inherent in its being laid down first rather than backfilled. The bonding process and the resultant structure are particularly appropriate for materials designed to operate at higher energies, and/or with relatively large pixel sizes, for example in the range 0.1 mm (and especially 0.2 mm) to 2 mm, such as is typical for pixel detector devices designed for higher energy radiation application, for example of the cadmium telluride type.

The invention claimed is:

1. A method of bonding a semiconductor structure to a substrate to effect both a mechanical bond and a selectively patterned conductive bond, comprising the steps of:
    mechanically bonding a semiconductor structure to a substrate by means of a bonding layer;
    providing gaps in the bonding layer generally corresponding to a desired conductive bond pattern and providing vias through the substrate generally positioned at the gaps in bonding layer by:
        providing a complete bonding layer free of gaps to mechanically bond a semiconductor structure to a substrate,
        providing the vias through the substrate, and
        removing material from the bonding layer at the location of the vias to expose areas of the surface of the semiconductor structure;
    causing electrically conductive material to directly contact the semiconductor structure exposed through the vias and the gaps; and to the extent necessitated by the nature of the conductive material, further treating the conductive material to complete a conductive connection between the semiconductor structure and the substrate.

2. A method in accordance with claim 1 wherein the step of mechanically bonding a semiconductor structure to a substrate comprises creating a bonding layer of curable flowable polymer, by causing it to flow between the semiconductor structure and the substrate so as to be in intimate contact with a facing surface of each, and curing the polymer.

3. A method in accordance with claim 1 comprising removing material from the bonding layer through the vias by selectively etching material from the bonding layer through the vias.

4. A method in accordance with claim 3 wherein material from the bonding layer is first selectively developed through the vias to make it more susceptible to selective removal and then developed material is chemically removed.

5. A method in accordance with claim 4 wherein material from the bonding layer is selectively removed through the vias via a photolithographic technique.

6. A method in accordance with claim 5 wherein the bonding material is a photosensitive material, and the method comprises exposing the photosensitive material in the selectively patterned areas through the selectively patterned vias, removing exposed material by dissolution through the vias, and passing conductive material through the vias to deposit conductive material on the surfaces of the device structure exposed thereby.

7. A method in accordance with claim 1 wherein the step of causing electrically conductive material to contact the semiconductor structure exposed through the via comprises depositing electrically conductive material through the via and the gap.

8. A method in accordance with claim 7 wherein electrically conductive material is plated or sputtered into the via and onto the contact surface of the semiconductor to complete a conductive connection.

9. A method in accordance with claim 1 wherein the step of causing electrically conductive material to contact the semiconductor structure through the via comprises passing an elongate electrical conductor through the via and effecting a conductive connection of the conductor onto the contact surface of the semiconductor.

\* \* \* \* \*